US011345837B2

(12) United States Patent
Moriya et al.

(10) Patent No.: US 11,345,837 B2
(45) Date of Patent: May 31, 2022

(54) TEMPORARY ADHESIVE CONTAINING PHENYL GROUP-CONTAINING POLYSILOXANE

(71) Applicant: NISSAN CHEMICAL CORPORATION, Tokyo (JP)

(72) Inventors: Shunsuke Moriya, Toyama (JP); Tomoyuki Enomoto, Toyama (JP); Tetsuya Shinjo, Toyama (JP); Hiroshi Ogino, Toyama (JP); Kazuhiro Sawada, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 9 days.

(21) Appl. No.: 16/627,993

(22) PCT Filed: Jul. 5, 2018

(86) PCT No.: PCT/JP2018/025542
§ 371 (c)(1),
(2) Date: Dec. 31, 2019

(87) PCT Pub. No.: WO2019/009365
PCT Pub. Date: Jan. 10, 2019

(65) Prior Publication Data
US 2020/0216731 A1     Jul. 9, 2020

(30) Foreign Application Priority Data

Jul. 6, 2017   (JP) .............................. JP2017-133094

(51) Int. Cl.
| | | |
|---|---|---|
| *C09J 183/04* | (2006.01) | |
| *C08G 77/00* | (2006.01) | |
| *C09J 5/06* | (2006.01) | |
| *H01L 21/304* | (2006.01) | |
| *H01L 21/683* | (2006.01) | |
| *C09J 4/00* | (2006.01) | |
| *B29C 71/02* | (2006.01) | |
| *C08G 77/08* | (2006.01) | |

(52) U.S. Cl.
CPC ............ *C09J 183/04* (2013.01); *C08G 77/70* (2013.01); *C08G 77/80* (2013.01); *C08J 7/08* (2013.01); *C09J 4/00* (2013.01); *C09J 5/06* (2013.01); *H01L 21/304* (2013.01); *H01L 21/6836* (2013.01); *C08G 77/08* (2013.01); *C09J 2203/326* (2013.01); *H01L 2221/6834* (2013.01); *H01L 2221/68327* (2013.01)

(58) Field of Classification Search
CPC ................ C09J 183/04; C08L 2205/03; C08L 2205/035; C08G 77/80
USPC .................................................. 524/266–268
See application file for complete search history.

(56) References Cited

U.S. PATENT DOCUMENTS

| | | |
|---|---|---|
| 2006/0166464 A1 | 7/2006 | Jakob et al. |
| 2008/0090380 A1 | 4/2008 | Gardner et al. |
| 2009/0176349 A1 | 7/2009 | Jakob et al. |
| 2010/0043608 A1 | 2/2010 | Jakob |
| 2011/0272092 A1 | 11/2011 | Richter |
| 2012/0028438 A1 | 2/2012 | Richter |
| 2013/0023109 A1 | 1/2013 | Harkness |
| 2014/0150972 A1 | 6/2014 | Koellnberger et al. |
| 2016/0194457 A1* | 7/2016 | Takei .................... C08L 83/14 528/31 |
| 2016/0280918 A1 | 9/2016 | Kumar et al. |
| 2017/0190911 A1* | 7/2017 | Iimura .................... H01L 23/29 |
| 2018/0037013 A1* | 2/2018 | Endo .................... B32B 27/283 |
| 2022/0002602 A1* | 1/2022 | Sawada ................ B32B 43/006 |

FOREIGN PATENT DOCUMENTS

| | | | |
|---|---|---|---|
| JP | 2003-007314 A | 1/2003 | |
| JP | 2006-508540 A | 3/2006 | |
| JP | 2008-532313 A | 8/2008 | |
| JP | 2009-528688 A | 8/2009 | |
| JP | 2012-510715 A | 5/2012 | |
| JP | 2012-513684 A | 6/2012 | |
| JP | 2013-520009 A | 5/2013 | |
| JP | 2013-179135 A | 9/2013 | |
| JP | 2013-232459 A | 11/2013 | |
| JP | 2014-525953 A | 10/2014 | |

(Continued)

OTHER PUBLICATIONS

Sep. 4, 2018 International Search Report issued in International Patent Application No. PCT/JP2018/025542.

(Continued)

*Primary Examiner* — Marc S Zimmer
(74) *Attorney, Agent, or Firm* — Oliff PLC

(57) ABSTRACT

An adhesive for separatably attaching a support to a circuit side of a wafer to process a rear surface of the wafer, the adhesive including a component (A) that is cured by a hydrosilylation reaction and a component (B) containing a phenyl group-containing polyorganosiloxane, wherein a ratio in % by mass of the component (A) to the component (B) is 95:5 to 30:70. A separation method including applying the adhesive onto a first body to form an adhesion layer, attaching a second body to the adhesion layer, heating the adhesion layer from a side of the first body to cure the adhesive to form a layered body, processing the layered body, and carrying out separation between the adhesion layer, and the first and second bodies. The processing may be polishing the rear surface of the wafer.

19 Claims, No Drawings

(56) References Cited

FOREIGN PATENT DOCUMENTS

WO      2010/032870 A1     3/2010
WO      2015/093283 A1     6/2015

OTHER PUBLICATIONS

Sep. 4, 2018 Written Opinion of the International Searching Authority issued in International Patent Application Mo. PCT/JP2018/025542.
Feb. 11, 2021 European Extended Search Report issued in European Patent Application No. 18828060.6.

\* cited by examiner

TEMPORARY ADHESIVE CONTAINING PHENYL GROUP-CONTAINING POLYSILOXANE

TECHNICAL FIELD

The present invention relates to a temporary adhesive for fixing a wafer on a support when a rear surface of the wafer is polished, and a layered body using the same.

BACKGROUND ART

For conventional semiconductor wafers that are two-dimensionally integrated in a plane direction, a semiconductor integration technology of further integrating (layering) planes of wafers in a three-dimensional direction for further integration has been required. The layering in the three-dimensional direction is a technology in which wafers are integrated into a multilayer so as to be connected with a through silicon via (TSV). When semiconductor wafers are integrated into a multilayer, each of the semiconductor wafers to be integrated is thinned by polishing a surface (i.e., a rear surface) opposite to a surface on which a circuit is formed, and the thinned semiconductor wafers are layered.

A semiconductor wafer (herein, also simply referred to as a wafer) before thinning is attached to a support to be polished with a polisher. In this case, the attachment is referred to as temporary adhesion, since the semiconductor wafer needs to be easily separated after polishing. The temporary adhesion requires easy detachment from the support. When a large force is applied for the detachment, a thinned semiconductor wafer may be broken or deformed, and in order to avoid this, the thinned semiconductor wafer is easily detached. However, it is also undesirable that the semiconductor wafer be detached or shifted by a polishing stress while the rear surface of the semiconductor wafer is being polished. Therefore, the performance required for the temporary adhesion is the resistance to stress during polishing and easy detachment after polishing.

For example, performances such as high stress in a plane direction during polishing (high adhesion force) and low stress in a longitudinal direction during detachment (low adhesion force) are required.

As a process of such adhesion, a method in which an adhesion layer and a separation layer are provided, and the separation layer is formed by plasma polymerization of dimethylsiloxane and mechanically separated after polishing (see Patent Documents 1 and 2), a method in which a semiconductor wafer is attached to a supporting substrate with an adhesive composition, the rear surface of the semiconductor wafer is polished, and the adhesive is then removed by an etching solution (see Patent Document 3), and a wafer processed body including, as an adhesion layer for the attachment of a semiconductor wafer to a support, a combination of a polymerized layer obtained by polymerizing an alkenyl group-containing organopolysiloxane and a hydrosilyl group-containing organopolysiloxane using a platinum catalyst, and a polymerized layer composed of a thermosetting polysiloxane (see Patent Documents 4 to 7), are disclosed.

PRIOR ART DOCUMENTS

Patent Documents

Patent Document 1: Japanese Patent Application Publication (Translation of PCT Application) No. 2012-510715 (JP 2012-510715 A)
Patent Document 2: Japanese Patent Application Publication (Translation of PCT Application) No. 2012-513684 (JP 2012-513684 A)
Patent Document 3: Japanese Patent Application Publication (Translation of PCT Application) No. 2008-532313 (JP 2008-532313 A)
Patent Document 4: Japanese Unexamined Patent Application Publication No. 2013-179135 (JP 2013-179135 A)
Patent Document 5: Japanese Unexamined Patent Application Publication No. 2013-232459 (JP 2013-232459 A)
Patent Document 6: Japanese Unexamined Patent Application Publication No. 2006-508540 (JP 2006-508540 A)
Patent Document 7: Japanese Unexamined Patent Application Publication No. 2009-528688 (JP 2009-528688 A)

SUMMARY OF THE INVENTION

Problem to be Solved by the Invention

The present invention provides a temporary adhesive that has excellent spin coating properties of a circuit side of a wafer and a support, and excellent heat resistance when the circuit side of the wafer or the support is attached to an adhesion layer or when a rear surface of the wafer is processed, and is capable of easily separating the circuit side of the wafer from the support after polishing the rear surface of the wafer, and simply removing the adhesive attached to the wafer or the support after the separation; a layered body using the temporary adhesive; and a processing method using the layered body.

Means for Solving the Problems

A first aspect of the present invention is an adhesive for separatably attaching a support to a circuit side of a wafer to process a rear surface of the wafer, the adhesive comprising a component (A) that is cured by a hydrosilylation reaction and a component (B) containing a phenyl group-containing polyorganosiloxane, wherein a ratio in % by mass of the component (A) to the component (B) is 95:5 to 30:70.

A second aspect of the present invention is the adhesive according to the first aspect, wherein the component (A) comprises: a polysiloxane (A1) comprising a polysiloxane selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, and a siloxane unit (T unit) of $R^6SiO_{3/2}$ (with the proviso that $R^1$ to $R^6$ are each bonded to a silicon atom through a Si—C bond or a Si—H bond), and comprising a polyorganosiloxane (a1) wherein monovalent chemical groups of $R^1$ to $R^6$ each contain a $C_{1-10}$ alkyl group and a $C_{2-10}$ alkenyl group and a polyorganosiloxane (a2) wherein monovalent chemical groups of $R^1$ to $R^6$ each contain a $C_{1-10}$ alkyl group and a hydrogen atom; and a platinum group metal-based catalyst (A2).

A third aspect of the present invention is the adhesive according to the first or second aspect, wherein the component (B) is a combination of (b1) a phenylmethylsiloxane unit structure or a diphenylsiloxane unit structure and (b2) a dimethylsiloxane unit structure.

A fourth aspect of the present invention is the adhesive according to any one of the first to third aspects, wherein the processing is polishing the rear surface of the wafer.

A fifth aspect of the present invention is a method for attaching a layered body comprising applying the adhesive according to any one of the first to fourth aspects onto a first body to form an adhesion layer, attaching a second body to the adhesion layer, and heating the adhesion layer from a side of the first body.

A sixth aspect of the present invention is the method for attaching a layered body according to the fifth aspect, wherein the first body is a support, the second body is a wafer, and a circuit side of the wafer faces the first body.

A seventh aspect of the present invention is the method for attaching a layered body according to the fifth aspect, wherein the first body is a wafer, the second body is a support, and a circuit side of the wafer faces the second body.

An eighth aspect of the present invention is a separation method comprising applying the adhesive according to any one of the first to third aspects onto a first body to form an adhesion layer, attaching a second body to the adhesion layer, heating the adhesion layer from a side of the first body to cure the adhesive to form a layered body, processing the layered body, and carrying out separation between the adhesion layer, and the first body and the second body.

A ninth aspect of the present invention is a separation method comprising applying the adhesive according to the fourth aspect onto a first body to form an adhesion layer, attaching a second body to the adhesion layer, heating the adhesion layer from a side of the first body to cure the adhesive to form a layered body, processing the layered body, and carrying out separation between the adhesion layer, and the first body and the second body.

A tenth aspect of the present invention is the separation method according to the eighth aspect, wherein the first body is a support, the second body is a wafer, and a circuit side of the wafer faces the first body.

An eleventh aspect of the present invention is the separation method according to the ninth aspect, wherein the first body is a support, the second body is a wafer, and a circuit side of the wafer faces the first body.

A twelfth aspect of the present invention is the separation method according to the eighth aspect, wherein the first body is a wafer, the second body is a support, and a circuit side of the wafer faces the second body.

A thirteenth aspect of the present invention is the separation method according to the ninth aspect, wherein the first body is a wafer, the second body is a support, and a circuit side of the wafer faces the second body.

A fourteenth aspect of the present invention is the separation method according to any one of the eighth, tenth, and twelfth aspects, wherein the processing is polishing the rear surface of the wafer.

Effects of the Invention

The present invention provides an adhesive (temporary adhesive) for separatably attaching a support to a circuit side of a wafer to process a rear surface of the wafer, the adhesive comprising a component (A) that is cured by a hydrosilylation reaction and a phenyl group-containing polyorganosiloxane component (B).

A layered body that contains, as a temporary adhesive to be placed between a support and a circuit side of a wafer, the component (A) that is crosslinked and cured by a hydrosilylation reaction and the component (B) having phenyl group, and is for processing a rear surface of the wafer opposite to the circuit side of the wafer, includes a combination of specific polysiloxanes as components, and thereby achieves the following effects: It has excellent spin coating properties of the circuit side of the wafer, and excellent heat resistance when the circuit side of the wafer or the support is attached to the adhesion layer or the rear surface of the wafer is processed. Separation can be easily carried out after processing the rear surface of the wafer, that is, after polishing. After the separation, the adhesive attached to the wafer or the support can be simply removed with a solvent or tape.

In the processing of a side opposite to the circuit side of the wafer, the wafer is thinned by polishing. Subsequently, a through silicon via (TSV) or the like is formed on the wafer. Subsequently, the thinned wafer is separated from the support and a layered body of the wafer is formed. Thus, three-dimensional mounting is carried out. Before or after this time, an electrode or the like on the rear surface of the wafer is also formed. In the thinning of the wafer and the TSV process, the wafer is heated at 250 to 350° C. with the wafer attached to the support. However, the layered body as the adhesive used in the present invention has heat resistance thereto.

MODES FOR CARRYING OUT THE INVENTION

The present invention is an adhesive for separatably attaching a support to a circuit side of a wafer to process a rear surface of the wafer, the adhesive comprising a component (A) that is cured by a hydrosilylation reaction and a component (B) containing a phenyl group-containing polyorganosiloxane, wherein a ratio in % by mass of the component (A) to the component (B) is 95:5 to 30:70.

In the present invention, the support is temporarily attached to the wafer with the adhesive, and the rear surface opposite to the circuit side of the wafer is processed by polishing, for example. Thus, the thickness of the wafer can be decreased.

The temporary attachment means that when the rear surface of the wafer is polished, the support is attached to the wafer, and the support can be separated from the thinned wafer after polishing the rear surface of the wafer.

Herein, separatable means that the separation strength is lower than that at another part to be separated, and separation is easy.

In the present invention, the adhesion layer is formed by the adhesive. The adhesive contains the components (A) and (B), and can further contain other additives.

The component (A) comprises a polysiloxane (A1) comprising a polysiloxane selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, and a siloxane unit (T unit) of $R^6SiO_{3/2}$ (with the proviso that $R^1$ to $R^6$ are each bonded to a silicon atom through a Si—C bond or a Si—H bond), and comprising a polyorganosiloxane (a1) wherein monovalent chemical groups of $R^1$ to $R^6$ each contain a $C_{1-10}$ alkyl group and a $C_{2-10}$ alkenyl group and a polyorganosiloxane (a2) wherein monovalent chemical groups of $R^1$ to $R^6$ each contain a $C_{1-10}$ alkyl group and a hydrogen atom; and a platinum group metal-based catalyst (A2).

The polysiloxane (A1) contains the polyorganosiloxane (a1) and the polyorganosiloxane (a2). The polyorganosiloxane (a1) contains a $C_{1-10}$ alkyl group and a $C_{2-10}$ alkenyl group, and the polyorganosiloxane (a2) contains a $C_{1-10}$ alkyl group and a hydrogen atom. The alkenyl group and the Si—H group are subjected to a hydrosilylation reaction using the platinum group metal-based catalyst (A2) to form a crosslinking structure, resulting in curing.

The polyorganosiloxane (a1) is selected from the Q unit, the M unit, the D unit, and the T unit. For example, the polyorganosiloxane (a1) can be formed by a combination of (the Q unit and the M unit) and (the D unit and the M unit), a combination of (the T unit and the M unit) and (the D unit and the M unit), a combination of (the Q unit, the T unit, and the M unit) and (the T unit and the M unit), a combination of (the T unit and the M unit), or a combination of (the Q unit and the M unit).

The polyorganosiloxane (a2) is selected from the Q unit, the M unit, the D unit, and the T unit. For example, the polyorganosiloxane (a2) can be formed by a combination of (the M unit and the D unit), a combination of (the Q unit and the M unit), or a combination of (the Q unit, the T unit, and the M unit).

Examples of the $C_{2-10}$ alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dipentenylmethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, and 1-i-propyl-2-propenyl group. In particular, ethenyl group, that is, vinyl group, or 2-propenyl group, that is, allyl group, can be preferably used.

Examples of the $C_{1-10}$ alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group. In particular, methyl group can be preferably used.

The polyorganosiloxane (a1) contains the $C_{1-10}$ alkyl group and the $C_{2-10}$ alkenyl group, wherein the $C_{1-10}$ alkyl group is methyl group, and the $C_{2-10}$ alkenyl group is ethenyl group, that is, vinyl group. In all substituents of $R^1$ to $R^6$, the ratio of the alkenyl group may be 0.1 to 50.0% by mole, preferably 0.5 to 30.0% by mole, and the rest of $R^1$ to $R^6$ may be alkyl groups.

The polyorganosiloxane (a2) contains the $C_{1-10}$ alkyl group and a hydrogen atom, wherein the $C_{1-10}$ alkyl group is methyl group, and the hydrogen atom forms a Si—H structure. In all the substituents of $R^1$ to $R^6$, the ratio of the hydrogen atom, that is, a Si—H group, may be 0.1 to 50.0% by mole, preferably 10.0 to 40.0% by mole, and the rest of $R^1$ to $R^6$ may be alkyl groups.

The polyorganosiloxane (a1) and the polyorganosiloxane (a2) may contain the alkenyl group and the hydrogen atom represented by the Si—H group at a molar ratio in the range from 2.0:1.0, preferably 1.5:1.0.

The weight average molecular weight of each of the polyorganosiloxanes (a1) and (a2) to be used may fall within the range of 500 to 1,000,000 or 5,000 to 50,000.

The component (A) contains the platinum group metal-based catalyst (A2). A platinum-based metal catalyst is a catalyst for promoting a hydrosilylation addition reaction of the alkenyl group with the Si—H group. A platinum-based metal catalyst, such as platinum black, platinum chloride, chloroplatinic acid, a reaction product of chloroplatinic acid with a monovalent alcohol, a complex of chloroplatinic acid with an olefin, or platinum bisacetoacetate, is used. Examples of the complex of platinum with an olefin include a complex of divinyltetramethyldisiloxane with platinum. The amount of the platinum catalyst to be added may fall within the range of 1.0 to 50.0 ppm relative to the total amount of the polyorganosiloxanes (a1) and (a2).

The component (A) may further contain an alkynyl alcohol as an inhibitor (A3) for inhibiting the advance of the hydrosilylation reaction. Examples of the inhibitor include 1-ethynyl-1-cyclohexanol. The inhibitor may be added in an amount in the range from 1000.0 to 10,000.0 ppm relative to the total amount of the polyorganosiloxanes (a1) and (a2).

As the polyorganosiloxane used in the component (B) of the present invention, a combination of (b1) a phenylmethylsiloxane unit structure or a diphenylsiloxane unit structure and (b2) a dimethylsiloxane unit structure can be used.

The phenylmethylsiloxane unit structure or diphenylsiloxane unit structure (b1) contains a siloxane unit (D unit) of $R^1R^2SiO_{2/2}$ (with the proviso that $R^1$ and $R^2$ are each bonded to a silicon atom through a Si—C bond), wherein $R^1$ is phenyl group or a $C_{1-10}$ alkyl group (particularly preferably methyl group), and $R^2$ is phenyl group.

The dimethylsiloxane unit structure (b2) contains a siloxane unit (D unit) of $R^1R^2SiO_{2/2}$ (with the proviso that $R^1$ and $R^2$ are each bonded to a silicon atom through a Si—C bond), wherein $R^1$ and $R^2$ are each a $C_{1-10}$ alkyl group (particularly preferably methyl group).

The alkyl group is preferably methyl group, and the phenyl group is bonded to a silicon atom via a linking group or directly.

The polyorganosiloxane used in the component (B) contains a siloxane unit (D unit), and may also contain the Q unit, the M unit, and the T unit. For example, the polyorganosiloxane may contain only the D unit, a combination of the D unit and the Q unit, a combination of the D unit and the M unit, a combination of the D unit and the T unit, a combination of the D unit, the Q unit, and the M unit, a combination of the D unit, the M unit, and the T unit, or a combination of the D unit, the Q unit, the M unit, and the T unit.

The weight average molecular weight of the component (B) falls within the range of 1,500 to 500,000, and preferably 1,500 to 100,000.

In terms of adhesion, the ratio of the component (A) to the component (B) in the adhesive may be any ratio. In order to further achieve a favorable separation property, it is desirable that the component (B) be contained in an amount of 5% by mass or more, and in order to maintain mechanical physical properties of the adhesive, it is desirable that the component (B) be contained in an amount of 70% by mass or less. In the adhesive, the ratio in % by mass of the component (A) to the component (B) may be 95:5 to 30:70.

The present invention includes a method for attaching a layered body comprising applying the aforementioned adhesive onto a first body to form an adhesion layer, attaching a second body to the adhesion layer, and heating the adhesion layer from a side of the first body. The adhesive is cured by heating.

The present invention includes the method for attaching a layered body, wherein the first body is a support, the second body is a wafer, and a circuit side of the wafer faces the first body.

The present invention also includes the method for attaching a layered body, wherein the first body is a wafer, the second body is a support, and a circuit side of the wafer faces the second body.

Examples of the wafer include a silicon wafer having a diameter of 300 mm and a thickness of about 770 μm.

Examples of the support (carrier) include a glass wafer and a silicon wafer that have a diameter of 300 mm and a thickness of about 700 mm.

The adhesion layer is formed by, for example, applying the adhesive onto the support with a spin coater. The layered body may be formed by attaching the support to the circuit side of the wafer so that the adhesive is disposed between the support and the wafer, and curing the adhesive by heating at a temperature of 120 to 260° C.

Alternatively, the adhesion layer may be formed by applying the adhesive to the circuit side of the wafer with a spin coater, with the rear surface of the wafer facing downward, and the layered body may be formed by attaching the support to the wafer so that the adhesive is disposed between the support and the wafer, and curing the adhesive by heating at a temperature of 120 to 260° C. The curing of the adhesive starts at a heating temperature of about 120° C. The heating temperature may be 260° C. or higher. From the viewpoint of the heat resistance of the circuit side (device side) of the wafer, the heating temperature is preferably 260° C. or lower. For example, the heating temperature may be about 150 to 220° C. or about 190 to 200° C. From the viewpoint of attachment of the wafer by curing, the heating time is preferably 1 minute or more. From the viewpoint of the stability of physical properties of the adhesive, the heating time is more preferably 5 minutes or more. For example, the heating time may be 1 to 180 minutes or 5 to 120 minutes. A heating device such as a hot plate or an oven may be used.

In order to adjust the viscosity of the adhesive, a solvent may be added. An aliphatic hydrocarbon, an aromatic hydrocarbon, a ketone, or the like may be used. Examples of solvents usable as the solvent include hexane, heptane, octane nonane, decane, undecane, dodecane, isododecane, menthane, limonene, toluene, xylene, metysilene, cumene, methyl isobutyl ketone (MIBK), butyl acetate, diisobutyl ketone, 2-octanone, 2-nonanone, and 5-nonanone.

When the support and the wafer are joined under reduced pressure (e.g., a reduced pressure of 10 to 10,000 Pa) so that the adhesion layer is disposed therebetween, the layered body can be formed. When the support and the wafer are joined, heating (e.g., at 30 to 100° C.) may also be carried out under reduced pressure.

The present invention includes a separation method comprising applying the aforementioned adhesive onto a first body to form an adhesion layer, attaching a second body to the adhesion layer, heating the adhesion layer to cure the adhesive to form a layered body, processing the layered body, and carrying out separation between the adhesion layer, and the first body and the second body (interface between the adhesion layer, and the first body and the second body).

The present invention includes the separation method, wherein the first body is a support, the second body is a wafer, and a circuit side of the wafer faces the first body.

The present invention also includes the separation method, wherein the first body is a wafer, the second body is a support, and a circuit side of the wafer faces the second body.

The thickness of the adhesion layer obtained by applying the adhesive may be 5 to 500 μm, 10 to 200 μm, 20 to 150 μm, 30 to 120 μm, or 30 to 70 μm.

In the processing of a side opposite to the circuit side of the wafer, the wafer is thinned by polishing, for example. Subsequently, a through silicon via (TSV) or the like is formed on the wafer. Subsequently, the thinned wafer is separated from the support and a layered body of the wafer is formed. Thus, three-dimensional mounting is carried out. Before or after this time, an electrode or the like on the rear surface of the wafer is also formed. In the thinning of the wafer and the TSV process, the wafer is heated at 250 to 350° C. with the wafer attached to the support. However, the layered body as the temporary adhesive used in the present invention has heat resistance thereto.

For example, a wafer having a diameter of 300 mm and a thickness of about 770 μm can be thinned to a thickness of about 80 to 4 μm, by polishing the rear surface opposite to the circuit side.

The wafer is attached to the support, the rear surface is processed (polished), and then the wafer is separated from the support. Examples of the separation method include separation using a solvent, separation using a laser, mechanical separation using a machine having a sharp part, and separation by pulling the support and the wafer.

When a resin remains on the surface of the wafer, the resin can be removed by washing with a solvent (dissolution, lift-off), tape peeling, or the like.

The present invention is a method for processing the layered body including achieving attachment by the aforementioned method, polishing the rear surface of the wafer, and then achieving separation by the aforementioned method.

EXAMPLES

Preparation of Component (A) for Adhesive 22.49 kg of a base polymer (manufactured by Wacker Chemie AG) including a vinyl group-containing linear polydimethylsiloxane having a viscosity of 200 mPa s and a vinyl group-containing MQ resin as a polysiloxane (a1), 1.46 kg of a SiH group-containing linear polydimethylsiloxane (manufactured by Wacker Chemie AG) having a viscosity of 70 mPa·s as a polysiloxane (a2), 0.63 kg of a SiH group-containing linear polydimethylsiloxane (manufactured by Wacker Chemie AG) having a viscosity of 100 mPa·s as a polysiloxane (a2), and 63.5 g of 1-ethynylcyclohexanol (manufactured by Wacker Chemie AG) as an inhibitor (A3) were stirred for 40 minutes with a stirrer (planetary mixer manufactured by INOUE MFG., INC.). Separately, 30.4 g of a platinum catalyst (manufactured by Wacker Chemie AG) as a platinum group metal-based catalyst (A2) and 1.05 kg of a vinyl group-containing linear polydimethylsiloxane (manufactured by Wacker Chemie AG) having a viscosity of 1,000 mPa·s as a polysiloxane (a1) were stirred for 30 minutes with Three-one motor (manufactured by Shinto Scientific Co., Ltd.) to obtain a mixture. 0.98 kg of the mixture was added to the aforementioned mixture, and the mixture was further stirred for 40 minutes, and lastly, the mixture was filtered through a 5-μm polypropylene (PP) filter to obtain a component (A) for an adhesive.

(Adhesive 1)

A mixture composed of 99% by mass of the polyorganosiloxane as the component (A) (the ratio of the component (A) in the component (A) and a component (B-1)) and 1% by mass of a phenyl group-modified silicone as the component (B-1) (trade name PMM-1043 manufactured by Gelest, Inc., weight average molecular weight: 67,000, viscosity: 30,000 mm$^2$/s) (the ratio of the component (B-1) in the component (A) and the component (B-1)) was mixed with a planetary centrifugal mixer (trade name ARE-500 manufactured by THINKY CORPORATION) for 5 minutes to prepare the (Adhesive 1).

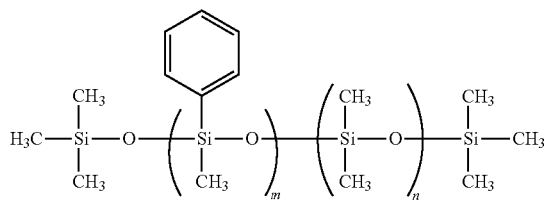

Formula (B-1)

wherein m and n are each the number of repeating units.

(Adhesive 2)

A mixture composed of 97.5% by mass of the polyorganosiloxane as the component (A) (the ratio of the component (A) in the component (A) and the component (B-1)) and 2.5% by mass of a phenyl group-modified silicone as the component (B-1) (trade name PMM-1043 manufactured by Gelest, Inc., weight average molecular weight: 67,000, viscosity: 30,000 mm$^2$/s) (the ratio of the component (B-1) in the component (A) and the component (B-1)) was mixed with a planetary centrifugal mixer (trade name ARE-500 manufactured by THINKY CORPORATION) for 5 minutes to prepare the (Adhesive 2).

(Adhesive 3)

A mixture composed of 95% by mass of the polyorganosiloxane as the component (A) (the ratio of the component (A) in the component (A) and the component (B-1)) and 5% by mass of a phenyl group-modified silicone as the component (B-1) (trade name PMM-1043 manufactured by Gelest, Inc., weight average molecular weight: 67,000, viscosity: 30,000 mm$^2$/s) (the ratio of the component (B-1) in the component (A) and the component (B-1)) was mixed with a planetary centrifugal mixer (trade name ARE-500 manufactured by THINKY CORPORATION) for 5 minutes to prepare the (Adhesive 3).

(Adhesive 4)

A mixture composed of 90% by mass of the polyorganosiloxane as the component (A) (the ratio of the component (A) in the component (A) and the component (B-1)) and 10% by mass of a phenyl group-modified silicone as the component (B-1) (trade name PMM-1043 manufactured by Gelest, Inc., weight average molecular weight: 67,000, viscosity: 30,000 mm$^2$/s) (the ratio of the component (B-1) in the component (A) and the component (B-1)) was mixed with a planetary centrifugal mixer (trade name ARE-500 manufactured by THINKY CORPORATION) for 5 minutes to prepare the (Adhesive 4).

(Adhesive 5)

A mixture composed of 85% by mass of the polyorganosiloxane as the component (A) (the ratio of the component (A) in the component (A) and the component (B-1)) and 15% by mass of a phenyl group-modified silicone as the component (B-1) (trade name PMM-1043 manufactured by Gelest, Inc., weight average molecular weight: 67,000, viscosity: 30,000 mm$^2$/s) (the ratio of the component (B-1) in the component (A) and the component (B-1)) was mixed with a planetary centrifugal mixer (trade name ARE-500 manufactured by THINKY CORPORATION) for 5 minutes to prepare the (Adhesive 5).

(Adhesive 6)

A mixture composed of 70% by mass of the polyorganosiloxane as the component (A) (the ratio of the component (A) in the component (A) and the component (B-1)) and 30% by mass of a phenyl group-modified silicone as the component (B-1) (trade name PMM-1043 manufactured by Gelest, Inc., weight average molecular weight: 67,000, viscosity: 30,000 mm$^2$/s) (the ratio of the component (B-1) in the component (A) and the component (B-1)) was mixed with a planetary centrifugal mixer (trade name ARE-500 manufactured by THINKY CORPORATION) for 5 minutes to prepare the (Adhesive 6).

(Adhesive 7)

A mixture composed of 50% by mass of the polyorganosiloxane as the component (A) (the ratio of the component (A) in the component (A) and the component (B-1)) and 50% by mass of a phenyl group-modified silicone as the component (B-1) (trade name PMM-1043 manufactured by Gelest, Inc., weight average molecular weight: 67,000, viscosity: 30,000 mm$^2$/s) (the ratio of the component (B-1) in the component (A) and the component (B-1)) was mixed with a planetary centrifugal mixer (trade name ARE-500 manufactured by THINKY CORPORATION) for 5 minutes to prepare the (Adhesive 7).

(Adhesive 8)

A mixture composed of 30% by mass of the polyorganosiloxane as the component (A) (the ratio of the component (A) in the component (A) and the component (B-1)) and 70% by mass of a phenyl group-modified silicone as the component (B-1) (trade name PMM-1043 manufactured by Gelest, Inc., weight average molecular weight: 67,000, viscosity: 30,000 mm$^2$/s) (the ratio of the component (B-1) in the component (A) and the component (B-1)) was mixed with a planetary centrifugal mixer (trade name ARE-500 manufactured by THINKY CORPORATION) for 5 minutes to prepare the (Adhesive 8).

(Adhesive 9)

A mixture composed of 85% by mass of the polyorganosiloxane as the component (A) (the ratio of the component (A)

in the component (A) and a component (B-2)) and 15% by mass of a phenyl group-modified silicone as the component (B-2) (trade name PMM-1025 manufactured by Gelest, Inc., weight average molecular weight: 25,200, viscosity: 500 mm²/s) (the ratio of the component (B-2) in the component (A) and the component (B-2)) was mixed with a planetary centrifugal mixer (trade name ARE-500 manufactured by THINKY CORPORATION) for 5 minutes to prepare the (Adhesive 9).

Formula (B-2)

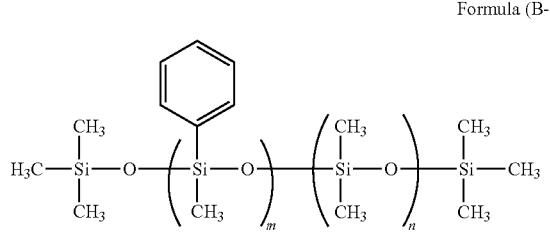

wherein m and n are each the number of repeating units.

(Adhesive 10)

A mixture composed of 85% by mass of the polyorganosiloxane as the component (A) (the ratio of the component (A) in the component (A) and a component (B-3)) and 15% by mass of a phenyl group-modified silicone as the component (B-3) (trade name KF50-3000CS manufactured by Shin-Etsu Chemical Co., Ltd., weight average molecular weight: 39,400, viscosity: 3,000 mm²/s) (the ratio of the component (B-3) in the component (A) and the component (B-3)) was mixed with a planetary centrifugal mixer (trade name ARE-500 manufactured by THINKY CORPORATION) for 5 minutes to prepare the (Adhesive 10).

Formula (B-3)

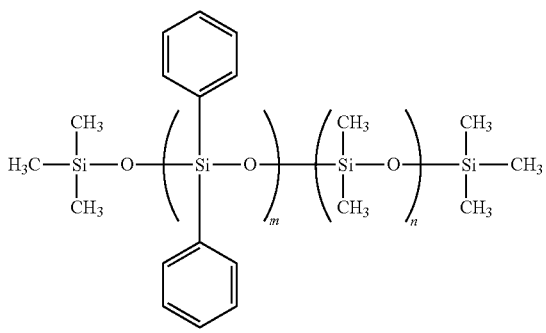

wherein m and n are each the number of repeating units.

(Adhesive 11)

A mixture composed of 85% by mass of the polyorganosiloxane as the component (A) (the ratio of the component (A) in the component (A) and a component (B-4)) and 15% by mass of a phenyl group-modified silicone as the component (B-4) (trade name TSF431 manufactured by MOMENTIVE INC., weight average molecular weight: 1,800, viscosity: 100 mm²/s) (the ratio of the component (B-4) in the component (A) and the component (B-4)) was mixed with a planetary centrifugal mixer (trade name ARE-500 manufactured by THINKY CORPORATION) for 5 minutes to prepare the (Adhesive 11).

Formula (B-4)

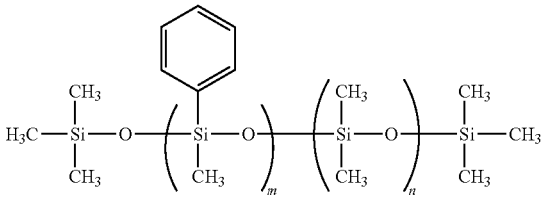

wherein m and n are each the number of repeating units.

(Adhesive 12)

A mixture composed of 85% by mass of the polyorganosiloxane as the component (A) (the ratio of the component (A) in the component (A) and a component (B-5)) and 15% by mass of a phenyl group-modified silicone as the component (B-5) (trade name TSF433 manufactured by MOMENTIVE INC., weight average molecular weight: 3,000, viscosity: 450 mm²/s) (the ratio of the component (B-5) in the component (A) and the component (B-5)) was mixed with a planetary centrifugal mixer (trade name ARE-500 manufactured by THINKY CORPORATION) for 5 minutes to prepare the (Adhesive 12).

Formula (B-5)

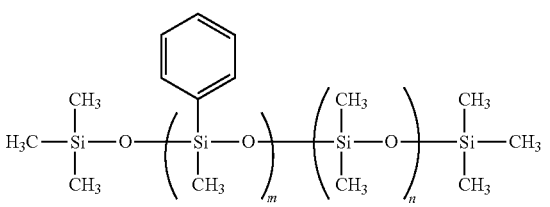

wherein m and n are each the number of repeating units.

(Adhesive 13)

A mixture composed of 85% by mass of the polyorganosiloxane as the component (A) (the ratio of the component (A) in the component (A) and a component (B-6)) and 15% by mass of a phenyl group-modified silicone as the component (B-6) (trade name PDM-0421 manufactured by Gelest, Inc., weight average molecular weight: 6,200, viscosity: 100 mm²/s) (the ratio of the component (B-6) in the component (A) and the component (B-6)) was mixed with a planetary centrifugal mixer (trade name ARE-500 manufactured by THINKY CORPORATION) for 5 minutes to prepare the (Adhesive 13).

Formula (B-6)

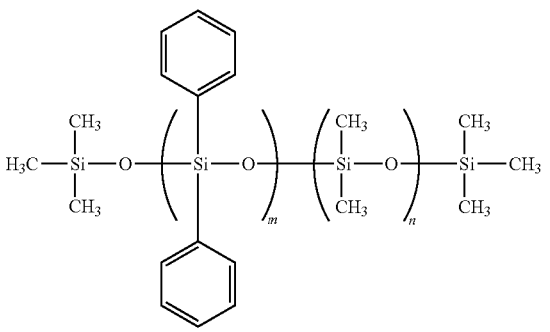

wherein m and n are each the number of repeating units.

(Adhesive 14)

A mixture composed of 85% by mass of the polyorganosiloxane as the component (A) (the ratio of the component (A) in the component (A) and a component (B-7)) and 15% by mass of a phenyl group-modified silicone as the component (B-7) (trade name PDM-0821 manufactured by Gelest, Inc., weight average molecular weight: 8,600, viscosity: 125 mm²/s) (the ratio of the component (B-7) in the component (A) and the component (B-7)) was mixed with a planetary centrifugal mixer (trade name ARE-500 manufactured by THINKY CORPORATION) for 5 minutes to prepare the (Adhesive 14).

Formula (B-7)

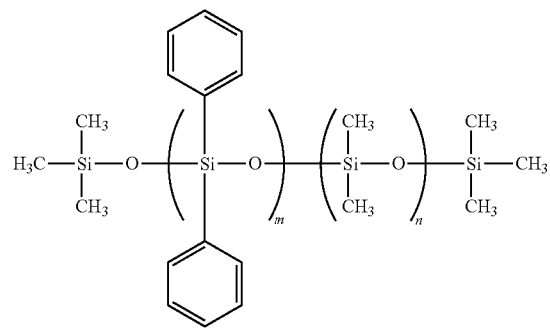

wherein m and n are each the number of repeating units.

Example 1

In order to form a temporary adhesion layer on a 300-mm silicon wafer (thickness: 770 μm) as a wafer on the device side, a film having a thickness of about 50 μm was formed using each of the adhesives (1) to (8) on the circuit side of the wafer by spin coating to form each of adhesion layers (1) to (8), respectively. This wafer having the adhesion layer was attached to a 300-mm glass wafer (thickness: 700 μm) as a wafer (support) on the carrier side with a vacuum attachment device (manual bonder manufactured by SUSS MicroTec AG) so that the adhesion layer was disposed between the wafer and the glass wafer. Thus, a layered body was produced.

The layered body was then heat-treated at 200° C. for 10 minutes on a hot plate. The presence or absence of a void was then checked from the side of the glass wafer (support). Regarding adhesion, a case where no void was observed after the heat treatment is denoted as "○", that is, good, and a case where a void was observed after the heat treatment is denoted as "x", that is, poor. The attached wafer was subsequently heat-treated at 220° C. for 10 minutes in an oven under a reduced pressure of 13 Pa. The presence or absence of a void was then checked from the side of the glass wafer (support). Regarding heat resistance, a case where no void was observed after the heat treatment is denoted as "○", that is, good, and a case where a void was observed after the heat treatment is denoted as "x", that is, poor. Furthermore, in order to check the separation property, the force required for separation was measured with a separation device (manual debonder manufactured by SUSS MicroTec AG). For a case where separation was achieved, the force required for the separation is shown in numerical values as a good result. A case where separation was not achieved is denoted as "x", that is, poor. Moreover, at the time of checking the separation property, the separated interface was checked. A case where the separation occurred at the interface between the wafer on the device side and the adhesion layer, and good control was achieved, is denoted as "Device". A case where the separation occurred at the interface between the wafer (support) on the carrier side and the adhesion layer, and good control was achieved, is denoted as "Carrier". A case where it could not be determined whether the separated interface was on the "Device" side or the "Carrier" side is denoted as "Δ". A case where cohesive failure occurred in the adhesion layer is denoted as "x". A case where separation was not achieved is denoted as "-". The results are shown in Table 1.

TABLE 1

(Results of Example 1)

| | Adhesion | Heat Resistance | Separation Property | Separated Interface |
|---|---|---|---|---|
| Adhesion Layer (1) | ○ | ○ | x | — |
| Adhesion Layer (2) | ○ | ○ | x | — |
| Adhesion Layer (3) | ○ | ○ | 26N | Carrier |
| Adhesion Layer (4) | ○ | ○ | 23N | Carrier |
| Adhesion Layer (5) | ○ | ○ | 20N | Carrier |
| Adhesion Layer (6) | ○ | ○ | 19N | Carrier |
| Adhesion Layer (7) | ○ | ○ | 20N | Carrier |
| Adhesion Layer (8) | ○ | ○ | 20N | Carrier |

The results shown in Table 1 reveal that the adhesion layers (1) and (2) had good results in terms of adhesion and heat resistance, but did not have a good result in terms of separation property. On the other hand, the adhesion layers (3) to (8) had good results in terms of adhesion, heat resistance, separation property, and control of the separated interface.

Example 2

In order to form a temporary adhesion layer on a 300-mm silicon wafer (thickness: 770 μm) as a wafer on the device side, a film having a thickness of about 50 μm was formed using the adhesive (5) on the circuit side of each of three wafers by spin coating to form each of adhesion layers (5-1) to (5-3). This wafer having the adhesion layer was attached to a 300-mm glass wafer (thickness: 700 μm) as a wafer (support) on the carrier side with a vacuum attachment device (manual bonder manufactured by SUSS MicroTec AG) so that the adhesion layer was disposed between the wafer and the glass wafer. Thus, a layered body was produced. The layered body was then heat-treated at 200° C. for 10 minutes on a hot plate. At this time, a case where the heat treatment was carried out with the wafer on the device side facing downward is denoted as "Device", and a case where the heat treatment was carried out with the wafer (support) on the carrier side facing downward is denoted as "Carrier". A case where the heat treatment was carried out at 200° C. for 10 minutes with an inert gas oven (manufactured by Espec Corporation) is denoted as "Oven".

Furthermore, in order to check the separation property, the force required for separation was measured with a separation device (manual debonder manufactured by SUSS MicroTec AG). For a case where separation was achieved, the force required for the separation is shown in numerical values as a good result. A case where separation was not achieved is denoted as "x", that is, poor. Moreover, at the time of checking the separation property, the separated interface was checked. A case where the separation occurred at the interface between the wafer on the device side and the adhesion layer, and good control was achieved, is denoted as "Device". A case where the separation occurred at the interface between the wafer (support) on the carrier side and the adhesion layer, and good control was achieved, is denoted as "Carrier". A case where separation was not achieved is denoted as "x", that is, poor. The results are shown in Table 2.

TABLE 2

(Results of Example 2)

|  | Heat-Treated Side | Separation Property | Separated Interface |
|---|---|---|---|
| Adhesion Layer (5-1) | Device | 20N | Carrier |
| Adhesion Layer (5-2) | Carrier | 17N | Carrier |
| Adhesion Layer (5-3) | Oven | 18N | Carrier |

The results shown in Table 2 reveal that the adhesion layers (5-1) to (5-3) formed from the adhesive (5) had good results in terms of separation property. The results also confirmed that the separated interface does not change depending on the heat-treatment method carried out in curing the adhesive, and separation can be achieved at the interface between the carrier and the adhesive.

Example 3

In order to form a temporary adhesion layer on a 300-mm silicon wafer (thickness: 770 μm) as a wafer on the device side, a film having a thickness of about 100 μm was formed using the adhesive (5) on the circuit side of the wafer by spin coating to form an adhesion layer (5-7). This wafer having the adhesion layer was attached to a 300-mm glass wafer (thickness: 700 μm) as a wafer (support) on the carrier side with a vacuum attachment device (manual bonder manufactured by SUSS MicroTec AG) so that the adhesion layer was disposed between the wafer and the glass wafer. Thus, a layered body was produced. The layered body was then heat-treated at 200° C. for 10 minutes on a hot plate with the wafer on the device side facing downward.

Then, in order to check the separation property, the force required for separation was measured with a separation device (manual debonder manufactured by SUSS MicroTec AG). For a case where separation was achieved, the force required for the separation is shown in numerical values as a good result. A case where separation was not achieved is denoted as "x", that is, poor. Moreover, at the time of checking the separation property, the separated interface was checked. A case where the separation occurred at the interface between the wafer on the device side and the adhesion layer, and good control was achieved, is denoted as "Device". A case where the separation occurred at the interface between the wafer (support) on the carrier side and the adhesion layer, and good control was achieved, is denoted as "Carrier". A case where separation was not achieved is denoted as "x", that is, poor. The results are shown in Table 3.

TABLE 3

(Results of Example 3)

|  | Thickness of Temporary Adhesion Layer | Separation Property | Separated Interface |
|---|---|---|---|
| Adhesion Layer (5-1) | 50 μm | 20N | Carrier |
| Adhesion Layer (5-7) | 100 μm | 23N | Carrier |

The results shown in Table 3 reveal that the adhesion layer (5-7) formed from the adhesive (5) had a good separation property regardless of the thickness of the adhesion layer.

Example 4

In order to form a temporary adhesion layer on a 300-mm silicon wafer (thickness: 770 μm) as a wafer on the device side, a film having a thickness of about 50 μm was formed using the adhesive (5) on the circuit side of each of four wafers by spin coating to form each of adhesion layers (5-8) to (5-11). This wafer having the adhesion layer was attached to a 300-mm glass wafer (thickness: 700 μm) as a wafer (support) on the carrier side with a vacuum attachment device (manual bonder manufactured by SUSS MicroTec AG) so that the adhesion layer was disposed between the wafer and the glass wafer. Thus, a layered body was produced. Each of the layered bodies was then heat-treated at 120, 150, 220, or 260° C. for 10 minutes on a hot plate with the wafer on the device side facing downward.

Then, in order to check the separation property, the force required for separation was measured with a separation device (manual debonder manufactured by SUSS MicroTec AG). For a case where separation was achieved, the force required for the separation is shown in numerical values as a good result. A case where separation was not achieved is denoted as "x", that is, poor. Moreover, at the time of checking the separation property, the separated interface was checked. A case where the separation occurred at the interface between the wafer on the device side and the adhesion layer, and good control was achieved, is denoted as "Device". A case where the separation occurred at the interface between the wafer (support) on the carrier side and the adhesion layer, and good control was achieved, is denoted as "Carrier". A case where separation was not achieved is denoted as "x", that is, poor. The results are shown in Table 4.

TABLE 4

(Results of Example 4)

|  | Heat-Treatment Temperature | Separation Property | Separated Interface |
|---|---|---|---|
| Adhesion Layer (5-8) | 120° C. | 17N | Carrier |
| Adhesion Layer (5-9) | 150° C. | 17N | Carrier |
| Adhesion Layer (5-10) | 220° C. | 18N | Carrier |
| Adhesion Layer (5-11) | 260° C. | 21N | Carrier |

The results shown in Table 4 reveal that the adhesion layers (5-8) to (5-11) formed from the adhesive (5) had good separation properties regardless of the heat-treatment temperature.

Example 5

In order to form a temporary adhesion layer on a 300-mm silicon wafer (thickness: 770 μm) as a wafer on the device side, a film having a thickness of about 50 μm was formed using each of the adhesives (5) and (9) to (14) on the circuit side of the wafer by spin coating to form each of adhesion layers (5-12) and (9) to (14), respectively. This wafer having the adhesion layer was attached to a 300-mm glass wafer (thickness: 700 μm) as a wafer (support) on the carrier side with a vacuum attachment device (manual bonder manufactured by SUSS MicroTec AG) so that the adhesion layer was disposed between the wafer and the glass wafer. Thus, a layered body was produced.

The layered body was then heat-treated at 200° C. for 10 minutes on a hot plate with the wafer on the device side facing downward. The presence or absence of a void was then checked from the side of the glass wafer. Regarding adhesion, a case where no void was observed after the heat treatment is denoted as "○", that is, good, and a case where a void was observed after the heat treatment is denoted as "x", that is, poor. Furthermore, in order to check the separation property, the force required for separation was measured with a separation device (manual debonder manufactured by SUSS MicroTec AG). For a case where separation was achieved, the force required for the separation is shown in numerical values as a good result. A case where separation was not achieved is denoted as "x", that is, poor. Moreover, at the time of checking the separation property, the separated interface was checked. A case where the separation occurred at the interface between the wafer on the device side and the adhesion layer, and good control was achieved, is denoted as "Device". A case where the separation occurred at the interface between the wafer (support) on the carrier side and the adhesion layer, and good control was achieved, is denoted as "Carrier". A case where it could not be determined whether the separated interface was on the "Device" side or the "Carrier" side is denoted as "Δ". A case where cohesive failure occurred in the adhesion layer is denoted as "x". A case where separation was not achieved is denoted as "-". The results are shown in Table 5.

TABLE 5

(Results of Example 5)

| | Adhesion | Heat Resistance | Separation Property | Separated Interface |
|---|---|---|---|---|
| Adhesion Layer (5-12) | ○ | ○ | 20N | Carrier |
| Adhesion Layer (9) | ○ | ○ | 32N | Carrier |
| Adhesion Layer (10) | ○ | ○ | 30N | Carrier |
| Adhesion Layer (11) | ○ | ○ | x | — |
| Adhesion Layer (12) | ○ | ○ | x | — |
| Adhesion Layer (13) | ○ | ○ | x | — |
| Adhesion Layer (14) | ○ | ○ | x | — |

The results shown in Table 5 reveal that the adhesion layers (5-12), (9), and (10) formed from the adhesive (5) had good adhesion and good separation properties.

Example 6

In order to form a temporary adhesion layer on a 300-mm trimmed silicon wafer (thickness: 770 μm) as a wafer on the device side, a film having a thickness of about 50 m was formed using the adhesive (5) on the circuit side of the wafer by spin coating to form an adhesion layer (5-13). This wafer having the adhesion layer was attached to a 300-mm silicon wafer (thickness: 770 μm) as a wafer (support) on the carrier side with a vacuum attachment device (manual bonder manufactured by SUSS MicroTec AG) so that the adhesion layer was disposed between the wafers. Thus, a layered body was produced.

The layered body was then heat-treated at 200° C. for 10 minutes on a hot plate with the wafer on the device side facing downward. The wafer on the device side was then thinned with a rear surface-grinding device (back grinder manufactured by TOKYO SEIMITSU CO., LTD.). After the thinning, the edge of the wafer on the device side was observed with an optical microscope. A case where chipping did not occur is denoted as "○", that is, good, and a case where chipping occurred is denoted as "x". The result is shown in Table 6.

TABLE 6

(Result of Example 6)

| | Chipping |
|---|---|
| Adhesion Layer (5-13) | ○ |

The result shown in Table 6 reveals that in the adhesion layer (5-13) formed from the adhesive (5), chipping was not observed in the thinning process of the wafer on the device side, and a good result was obtained.

Example 7

Cleaning Test for Device Wafer

In order to form a temporary adhesion layer on a 300-mm PI wafer (thickness: 770 μm, base: SiN+PI, scribe line: width 100 mm, 15-mm pitch) manufactured by Global Net Corporation as a wafer on the device side, a film having a thickness of about 50 μm was formed using the adhesive (5) on the circuit side of the wafer by spin coating to form an adhesion layer (5-14). This wafer having the adhesion layer was attached to a 300-mm glass wafer (thickness: 770 μm) as a wafer (support) on the carrier side with a vacuum attachment device (manual bonder manufactured by SUSS MicroTec AG) so that the adhesion layer was disposed between the wafer and the glass wafer. Thus, a layered body was produced.

The layered body was then heat-treated at 200° C. for 10 minutes on a hot plate with the wafer on the device side facing downward. Furthermore, in order to check the separation property, separation was carried out between the wafer on the device side and the adhesion layer (5-14) with a separation device (manual debonder manufactured by SUSS MicroTec AG). At this time, although most of the adhesion layer remained on the carrier side, in order to remove a very small amount of the adhesive remaining on the wafer on the device side, paddle cleaning was carried out for 10 minutes with a cleaner composed of tetrabutylammonium fluoride, diazabicycloundecene (DBU), and 2-heptanone. The surface was then observed with an optical microscope. A case where the adhesive was completely removed was evaluated as good, and is denoted as "○", and a case where the adhesive was not completely removed is denoted as "x". The result is shown in Table 7.

TABLE 7

(Result of Example 7)

| | Cleaning Test |
|---|---|
| Adhesion Layer (5-14) | ○ |

The result shown in Table 7 reveals that in the adhesion layer (5-14) formed from the adhesive (5), the surface of the wafer on the device side was completely cleaned by paddle cleaning with the aforementioned cleaner, and a good result was obtained.

Example 8

Lift-Off with Tape

In order to form a temporary adhesion layer on a 300-mm PI wafer (thickness: 770 μm, base: SiN+PI, scribe line: width 100 mm, 15-mm pitch) manufactured by Global Net Corporation as a wafer on the device side, a film having a thickness of about 50 μm was formed using the adhesive (5) on the circuit side of the wafer by spin coating to form an adhesion layer (5-15). This wafer having the adhesion layer was attached to a 300-mm glass wafer (thickness: 770 μm) as a wafer (support) on the carrier side with a vacuum attachment device (manual bonder manufactured by SUSS MicroTec AG) so that the adhesion layer was disposed between the wafer and the glass wafer. Thus, a layered body was produced.

The layered body was then heat-treated at 200° C. for 10 minutes on a hot plate with the wafer on the device side facing downward. Furthermore, in order to check the separation property, separation was carried out at the interface between the wafer on the device side and the adhesion layer (5-15) with a separation device (manual debonder manufactured by SUSS MicroTec AG).

As a comparison, an adhesive composed of the component (A) only was applied at a thickness of about 50 μm to a 300-mm glass wafer (thickness: 770 μm) as a wafer (support) on the carrier side to form an adhesion layer (A-1). The adhesion layer (A-1) was then heat-treated at 200° C. for 10 minutes.

Then, an adhesive separation test was carried out on each of the adhesion layers (5-15) and (A-1) remaining on the wafer (support) on the carrier side, by a tape peeling method using a terminal area-masking tape for printed circuit board plating (trade name N-300 manufactured by Nitto Denko Corporation). The test was carried out by applying the tape to the adhesive surface of the wafer (support) on the carrier side, and peeling off the tape at an angle in the range from 60 to 180° with respect to the wafer (support) on the carrier side, thereby separating each of the adhesion layers (5-15) and (A-1) from the wafer (support) on the carrier side.

A case where separation was achieved was evaluated as good, and is denoted as "○", and a case where separation was not achieved is denoted as "x"

TABLE 8

(Results of Example 8)

| | Tape Peeling Test |
|---|---|
| Adhesion Layer (5-15) | ○ |
| Adhesion Layer (A-1) | x |

The results shown in Table 8 reveal that the adhesion layer (5-15) formed from the adhesive (5) was removed by the lift-off process using the aforementioned tape, and a good result was obtained. On the other hand, the results did not confirm the removal by the lift-off process of the adhesion layer (A-1) formed from the component (A) mentioned as a comparative example.

Example 9

Regeneration Test for Carrier Wafer (Support) Using Solvent

In order to form a temporary adhesion layer on a 300-mm PI wafer (thickness: 770 μm, base: SiN+PI, scribe line: width 100 mm, 15-mm pitch) manufactured by Global Net Corporation as a wafer on the device side, a film having a thickness of about 50 μm was formed using the adhesive (5) on the circuit side of the wafer by spin coating to form an adhesion layer (5-16). This wafer having the adhesion layer was attached to a 300-mm glass wafer (thickness: 770 μm) as a wafer (support) on the carrier side with a vacuum attachment device (manual bonder manufactured by SUSS MicroTec AG) so that the adhesion layer was disposed between the wafer and the glass wafer. Thus, a layered body was produced.

The layered body was then heat-treated at 200° C. for 10 minutes on a hot plate with the wafer on the device side facing downward. Furthermore, in order to check the separation property, separation was carried out at the interface between the wafer on the device side and the adhesion layer (5-16) with a separation device (manual debonder manufactured by SUSS MicroTec AG).

As a comparison, an adhesive composed of the component (A) only was applied at a thickness of about 50 μm to a 300-mm glass wafer (thickness: 770 μm) as a wafer (support) on the carrier side to form an adhesion layer (A-2). The adhesion layer (A-2) was then heat-treated at 200° C. for 10 minutes.

Then, the adhesion layers (5-16) and (A-2) remaining on the wafer (support) on the carrier side were immersed in Isoper-E (hydrocarbon-based solvent manufactured by Andoh Parachemie Co., Ltd.) and Shellsol MC421 (hydrocarbon-based solvent manufactured by Shell Chemicals Japan Ltd.) to remove the adhesion layers using the solvent. A case where the adhesion layer could be removed by lift-off after immersion in the solvent was evaluated as good, and is denoted as "○", and a case where the adhesion layer could not be removed by lift-off after immersion in the solvent is denoted as "x".

TABLE 9

(Results of Example 9)

| | Isoper-E | Shellsol MC421 |
|---|---|---|
| Adhesion Layer (5-16) | ○ | ○ |
| Adhesion Layer (A-2) | x | x |

INDUSTRIAL APPLICABILITY

A layered body according to the present invention has a temporary adhesion layer as an additive between a support (supporting substrate) and a wafer. An adhesive that forms the temporary adhesion layer contains an adhesive containing a polyorganosiloxane component that is cured by a

The invention claimed is:

1. An adhesive for separatably attaching a support to a circuit side of a wafer to process a rear surface of the wafer, the adhesive comprising a component (A) that is cured by a hydrosilylation reaction and a component (B) containing a phenyl group-containing polyorganosiloxane,
wherein a ratio in % by mass of the component (A) to the component (B) is 85:15 to 30:70,
wherein the component (A) comprises a polysiloxane (A1) and a platinum group metal-based catalyst (A2),
wherein the polysiloxane (A1) comprises a polyorganosiloxane (a1) and a polyorganosiloxane (a2),
wherein the polyorganosiloxane (a1) contains a polysiloxane having at least one unit selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, and a siloxane unit (T unit) of $R^6SiO_{3/2}$, in which $R^1$ to $R^6$ are the same or different and each is selected from the group consisting of a $C_{1-10}$ alkyl group and a $C_{2-10}$ alkenyl group, wherein $R^1$ to $R^6$ are each bonded to the silicon atom through a Si—C bond, and wherein the polyorganosiloxane (a1) includes at least one $C_{1-10}$ alkyl group and at least one $C_{2-10}$ alkenyl group, and
wherein the polyorganosiloxane (a2) contains a polysiloxane having at least one unit selected from the group consisting of the Q unit, the M unit, the D unit, and the T unit, in which $R^1$ to $R^6$ are the same or different and each is selected from the group consisting of hydrogen and a $C_{1-10}$ alkyl group, wherein $R^1$ to $R^6$ are each bonded to the silicon atom through a Si—C bond except that when any of $R^1$ to $R^6$ are hydrogen, the bond is Si—H, and wherein the polyorganosiloxane (a2) includes at least one $C_{1-10}$ alkyl group and at least one hydrogen bonded to the silicon atom.

2. The adhesive according to claim 1, wherein the component (B) is a combination of (b1) a phenylmethylsiloxane unit structure or a diphenylsiloxane unit structure and (b2) a dimethylsiloxane unit structure.

3. The adhesive according to claim 2, wherein the polyorganosiloxane (a1) comprises
a combination of the Q unit, the M unit and the D unit,
a combination of the T unit, the M unit and the D unit,
a combination of the Q unit, the T unit, and the M unit,
a combination of the T unit and the M unit, or
a combination of the Q unit and the M unit.

4. The adhesive according to claim 1, wherein the polyorganosiloxane (a2) comprises
a combination of the M unit and the D unit,
a combination of the Q unit and the M unit, or
a combination of the Q unit, the T unit, and the M unit.

5. The adhesive according to claim 2, wherein the polyorganosiloxane (a2) comprises
a combination of the M unit and the D unit,
a combination of the Q unit and the M unit, or
a combination of the Q unit, the T unit, and the M unit.

6. The adhesive according to claim 3, wherein the polyorganosiloxane (a2) comprises
a combination of the M unit and the D unit,
a combination of the Q unit and the M unit, or
a combination of the Q unit, the T unit, and the M unit.

7. The adhesive according to claim 1, wherein in all the substituents of $R^1$ to $R^6$ of the polyorganosiloxane (a1), $C_{2-10}$ alkenyl groups comprise 0.1 to 50.0% by mole of the $R^1$ to $R^6$ and the rest of the $R^1$ to $R^6$ are $C_{1-10}$ alkyl groups.

8. The adhesive according to claim 1, wherein in all the substituents of $R^1$ to $R^6$ of the polyorganosiloxane (a2), hydrogen atoms comprise 0.1 to 50.0% by mole of the $R^1$ to $R^6$ and the rest of the $R^1$ to $R^6$ comprise $C_{1-10}$ alkyl groups.

9. The adhesive according to claim 8, wherein in all the substituents of $R^1$ to $R^6$ of the polyorganosiloxane (a1), $C_{2-10}$ alkenyl groups comprise 0.1 to 50.0% by mole of the $R^1$ to $R^6$ and the rest of the $R^1$ to $R^6$ are $C_{1-10}$ alkyl groups.

10. The adhesive according to claim 1, further comprising at least one solvent.

11. The adhesive according to claim 1, wherein the ratio in % by mass of the component (A) to the component (B) is 70:30 to 30:70.

12. The adhesive according to claim 1, wherein the polyorganosiloxane (a1) comprises
a combination of the Q unit, the M unit and the D unit,
a combination of the T unit, the M unit and the D unit,
a combination of the Q unit, the T unit, and the M unit,
a combination of the T unit and the M unit, or
a combination of the Q unit and the M unit.

13. An adhesive for separatably attaching a support to a circuit side of a wafer to process a rear surface of the wafer, the adhesive comprising a component (A) that is cured by a hydrosilylation reaction and a component (B) containing a phenyl group-containing polyorganosiloxane,
wherein a ratio in % by mass of the component (A) to the component (B) is 95:5 to 30:70,
wherein the component (A) comprises a polysiloxane (A1) and a platinum group metal-based catalyst (A2),
wherein the polysiloxane (A1) comprises a polyorganosiloxane (a1) and a polyorganosiloxane (a2),
wherein the polyorganosiloxane (a1) contains a polysiloxane having at least one unit selected from the group consisting of a siloxane unit (Q unit) of $SiO_2$, a siloxane unit (M unit) of $R^1R^2R^3SiO_{1/2}$, a siloxane unit (D unit) of $R^4R^5SiO_{2/2}$, and a siloxane unit (T unit) of $R^6SiO_{3/2}$, in which $R^1$ to $R^6$ are the same or different and each is selected from the group consisting of a $C_{1-10}$ alkyl group and a $C_{2-10}$ alkenyl group, wherein $R^1$ to $R^6$ are each bonded to the silicon atom through a Si—C bond, and wherein the polyorganosiloxane (a1) includes at least one $C_{1-10}$ alkyl group and at least one $C_{2-10}$ alkenyl group, and wherein the polyorganosiloxane (a1) comprises
a combination of the Q unit, the M unit and the D unit,
a combination of the T unit, the M unit and the D unit,
a combination of the Q unit, the T unit, and the M unit,
a combination of the T unit and the M unit, or
a combination of the Q unit and the M unit, and
wherein the polyorganosiloxane (a2) contains a polysiloxane having at least one unit selected from the group consisting of the Q unit, the M unit, the D unit, and the T unit, in which $R^1$ to $R^6$ are the same or different and each is selected from the group consisting of hydrogen and a $C_{1-10}$ alkyl group, wherein $R^1$ to $R^6$ are each bonded to the silicon atom through a Si—C bond except that when any of $R^1$ to $R^6$ are hydrogen, the bond is Si—H, and wherein the polyorganosiloxane (a2) includes at least one $C_{1-10}$ alkyl group and at least one hydrogen bonded to the silicon atom.

14. The adhesive according to claim 13, wherein the polyorganosiloxane (a2) comprises
   a combination of the M unit and the D unit,
   a combination of the Q unit and the M unit, or
   a combination of the Q unit, the T unit, and the M unit.

15. The adhesive according to claim 13, wherein the component (B) is a combination of (b1) a phenylmethylsiloxane unit structure or a diphenylsiloxane unit structure and (b2) a dimethylsiloxane unit structure.

16. The adhesive according to claim 13, wherein in all the substituents of $R^1$ to $R^6$ of the polyorganosiloxane (a1), $C_{2-10}$ alkenyl groups comprise 0.1 to 50.0% by mole of the $R^1$ to $R^6$ and the rest of the $R^1$ to $R^6$ are $C_{1-10}$ alkyl groups.

17. The adhesive according to claim 13, wherein in all the substituents of $R^1$ to $R^6$ of the polyorganosiloxane (a2), hydrogen atoms comprise 0.1 to 50.0% by mole of the $R^1$ to $R^6$ and the rest of the $R^1$ to $R^6$ comprise $C_{1-10}$ alkyl groups.

18. The adhesive according to claim 13, further comprising at least one solvent.

19. The adhesive according to claim 13, wherein the ratio in % by mass of the component (A) to the component (B) is 70:30 to 30:70.

\* \* \* \* \*